(12) United States Patent
Karr

(10) Patent No.: US 7,855,615 B1
(45) Date of Patent: Dec. 21, 2010

(54) FREQUENCY ADAPTIVE TEMPERATURE VARIABLE ATTENUATOR

(75) Inventor: Shawn E. Karr, Stuart, FL (US)

(73) Assignee: Smiths Interconnect Microwave Components, Inc., Stuart, FL (US)

( * ) Notice: Subject to any disclaimer, the term of this patent is extended or adjusted under 35 U.S.C. 154(b) by 57 days.

(21) Appl. No.: 12/114,492

(22) Filed: May 2, 2008

(51) Int. Cl.
*H03H 11/24* (2006.01)
(52) U.S. Cl. .................................... 333/81 A; 338/216
(58) Field of Classification Search ............... 333/81 A, 333/81 R; 338/22 R, 216
See application file for complete search history.

(56) References Cited

U.S. PATENT DOCUMENTS

| 6,846,693 | B2 * | 1/2005 | Kawase et al. ................. 438/55 |
| 7,215,219 | B2 * | 5/2007 | Roldan et al. ............. 333/81 A |
| 7,482,875 | B2 * | 1/2009 | Tanoue et al. ............... 330/289 |

* cited by examiner

*Primary Examiner*—Stephen E Jones
(74) *Attorney, Agent, or Firm*—Ward & Olivo LLP

(57) ABSTRACT

A temperature-dependent attenuator including one or more temperature-dependent resistors disposed in series with a transmission line and an inductive element shunting at least one of the temperature-dependent resistors.

3 Claims, 5 Drawing Sheets

FREQUENCY ADAPTIVE TEMPERATURE VARIABLE ATTENUATOR

CROSS REFERENCE TO RELATED APPLICATIONS

This application relates to U.S. Pat. No. 5,332,981 for "Temperature Variable Attenuator" and to U.S. Pat. No. 7,119,632 for "High Frequency Temperature Variable Attenuator" which are incorporated herein by reference.

FIELD OF THE INVENTION

This relates to temperature variable attenuators.

BACKGROUND OF THE INVENTION

Attenuators are used in applications that require signal level control. Level control can be accomplished by either reflecting a portion of the input signal back to its source or by absorbing some of the signal in the attenuator itself. The latter is often preferred because the mismatch which results from using a reflective attenuator can create problems for other devices in the system such as nonsymmetrical two-port amplifiers. It is for this reason that absorptive attenuators are more popular, particularly in microwave applications. The important parameters of an absorptive attenuator are: attenuation as a function of frequency; return loss; and stability over time and temperature.

It is known that variations in temperature can affect various component parts of a microwave system causing differences in signal strengths at different temperatures. In many cases, it is impossible or impractical to remove the temperature variations in some Radio Frequency (RF) components. For example, the gain of many RF amplifiers is temperature dependent. In order to build a system with constant gain, a temperature-dependent attenuator is placed in series with the amplifier. The attenuator is designed such that a temperature change that causes the gain of the amplifier to increase will simultaneously cause the attenuation of the attenuator to increase such that the overall gain of the amplifier-attenuator system remains relatively constant.

Another consideration is to assure that the impedance of an attenuator remains substantially constant over its operating range of interest. The above-referenced U.S. Pat. No. 5,332,981 describes a first such attenuator and U.S. Pat. No. 7,119,632 describes a second such attenuator.

FIG. 1 which is reproduced from FIG. 1 of the '632 patent is a schematic representation of a series absorptive attenuator 100 that includes three resistors R1, R2, R3 separated by transmission line sections 112 and 113. The resistor R1 is provided in series between a transmission line 111 and the transmission line section 112. The resistor R2 is provided in series between the transmission line section 112 and the transmission line section 113. The resistor R3 is provided in series between the transmission line section 113 and a transmission line 114. In one embodiment, the resistors R1-R3 are thick-film resistors; in another embodiment resistors R1-R3 are thin-film resistors. The transmission line section 112 is one-quarter wavelength long at a first desired center frequency. The transmission line section 113 is one-quarter wavelength long at a second desired center frequency. In one embodiment, the first desired center frequency will be the same as the second desired center frequency. In one embodiment, the resistors R1-R3 are temperature-dependent resistors (thermistors), where the resistance of each thermistor varies with temperature according to a temperature coefficient. In one embodiment, the resistors R1 and R3 have the same resistance and temperature coefficient. In one embodiment, the resistance of the resistor R2 is twice the resistance of the resistors R1 and R3. In one embodiment, the temperature coefficient of the resistor R2 is twice the temperature coefficient of the resistors R1 and R3. In one embodiment, the transmission lines 111-114 have the same characteristic impedance. FIG. 1 shows three resistors for purposes of illustration. One of ordinary skill in the art will recognize that two, three, four or more resistors separated by transmission line sections can be used.

The attenuator 100 behaves as a lossy transmission line, as the resistors R1-R3 absorb a portion of the energy propagating between the transmission line 111 and the transmission line 114. If the resistance of the resistors R1-R3 is different from the characteristic impedance of the transmission lines 111 and 114, then the resistors R1-R3 will produce undesired reflections on the transmission lines 111 or 114.

By making the transmission line sections 112 and 113 one quarter wavelength long at a desired frequency, the reflections from the resistors will cancel at the desired frequency, and thus the reflections on the transmission lines 111 and 114 will be reduced or eliminated at the center frequency and in a band about the desired center frequency.

One of ordinary skill in the art will recognize that two, three, four or more resistors separated by transmission line sections can be used. The transmission line sections can be of different length and/or different characteristic impedance (e.g., different width). In one embodiment, standard microwave filter design techniques are used to design the attenuator by selecting the parameters that do not vary with frequency (e.g., the number of resistors, the lengths and impedances of the transmission lines, etc.), and then determining the resistor values at a number of temperatures to match the desired attenuation-temperature profile over the desired bandwidth. Once the resistances at a number of temperatures are known, the temperature coefficients of each resistor are selected to produce the desired temperature profile in each resistor.

In one embodiment, the resistors R1-R3 are thick film resistors are produced by inks combining a metal powder, such as, for example, bismuth ruthenate, with glass frit and a solvent vehicle. This solution is deposited and then fired onto a ceramic substrate which is typically alumina but could also be beryllia ceramic, aluminum nitride, diamond, etc. When the resistor is fired, the glass frit melts and the metal particles in the powder adhere to the substrate, and to each other. This type of a resistor system can provide various ranges of material resistivities and temperature characteristics can be blended together to produce many different combinations.

The resistive characteristics of a thick film ink is specified in ohms-per-square. A particular resistor value can be achieved by either changing the geometry of the resistor or by blending inks with different resistivity. The resistance can be fine-tuned by varying the fired thickness of the resistor. This can be accomplished by changing the deposition thickness and/or the firing profile. Similar techniques can be used to change the temperature characteristics of the ink.

The temperature coefficient of a resistive ink defines how the resistive properties of the ink change with temperature. A convenient definition for the temperature coefficient of the resistive ink is the Temperature Coefficient of Resistance (TCR) often expressed in parts per million per degree Centigrade (PPM/C). The TCR can be used to calculate directly the amount of shift that can be expected from a resistor over a given temperature range. Once the desired TCR for a particular application is determined, it can be achieved by blending appropriate amounts of different inks. As with blending for sheet resistance, a TCR can be formed by blending two inks with TCR's above and below the desired TCR. One additional feature of TCR blending is that positive and negative TCR inks can be combined to produce large changes in the resulting material.

SUMMARY OF THE PRESENT INVENTION

Microwave attenuators such as that of FIG. 1 which are constructed with thermistor materials suffer degradation in performance as a function of increasing frequency due to parasitic and intrinsic capacitance. The present invention is an attenuator in which the intrinsic capacitance of a thermistor is offset by an inductive element. The attenuator is optimized for performance at microwave frequencies from 1 to 100 GHz. Operating temperatures range from −55 degrees C. to 125 degrees C.

In a preferred embodiment one or more series connected thermistors is shunted by an inductive element. Advantageously, the thermistors are connected by a quarter-wavelength transmission line.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
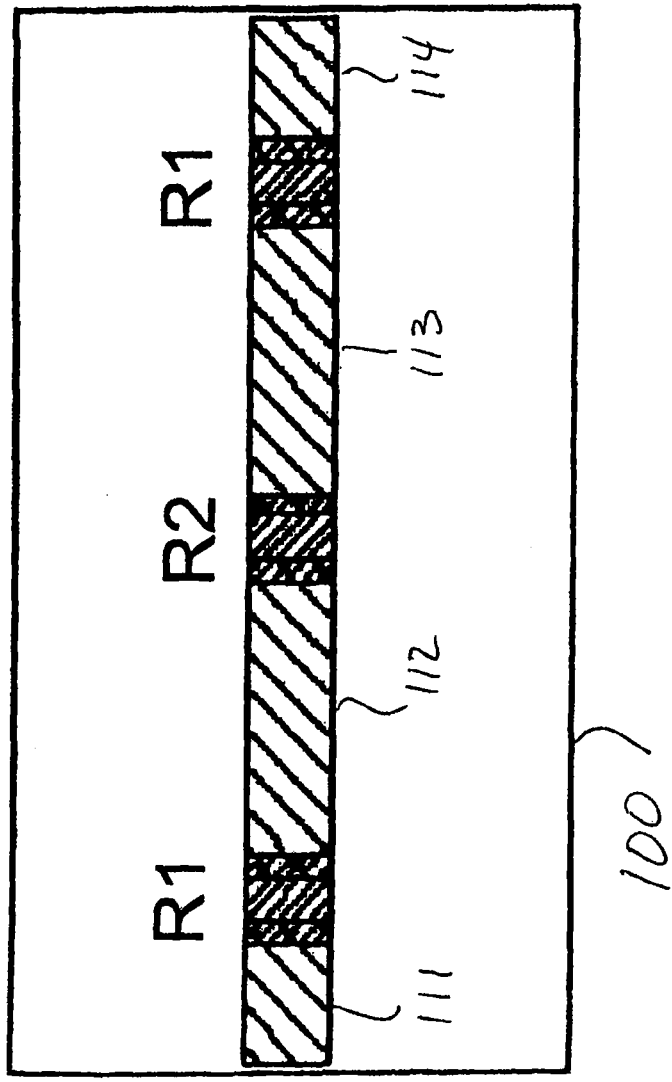
FIG. 1 is an illustration of a prior art temperature variable attenuator.
Figure 2:
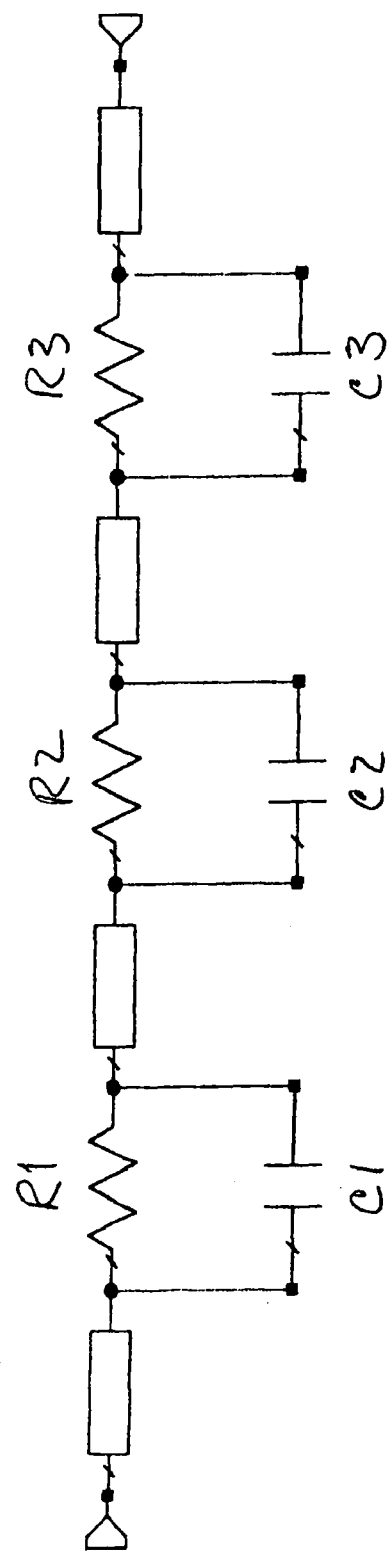
FIG. 2 is a circuit diagram of the attenuator of FIG. 1.

The thermistor elements R1-R3 of FIG. 1 have an intrinsic capacitance depicted as C1-C3 in the equivalent circuit model in FIG. 2. Thus, each thermistor element in the attenuator of FIG. 2 has a non-ideal impedance of $Z=(R/j\omega C)/(R+1/j\omega C)$ where R is the resistance of the thermistor and C is its intrinsic capacitance. This capacitance reduces the attenuation of the attenuator with increasing frequency.

An ideal RF attenuator has an impedance described by $Z=R+/-j0$, where the imaginary or reactive term is zero.

The present invention uses a transmission line element to realize an inductive term with an opposite reactance to the intrinsic capacitance such that the two reactances cancel. This cancellation is achieved where $j\omega L=-1/j\omega C$ where L is the inductance of the inductive element and C is the intrinsic capacitance.

Figure 3:
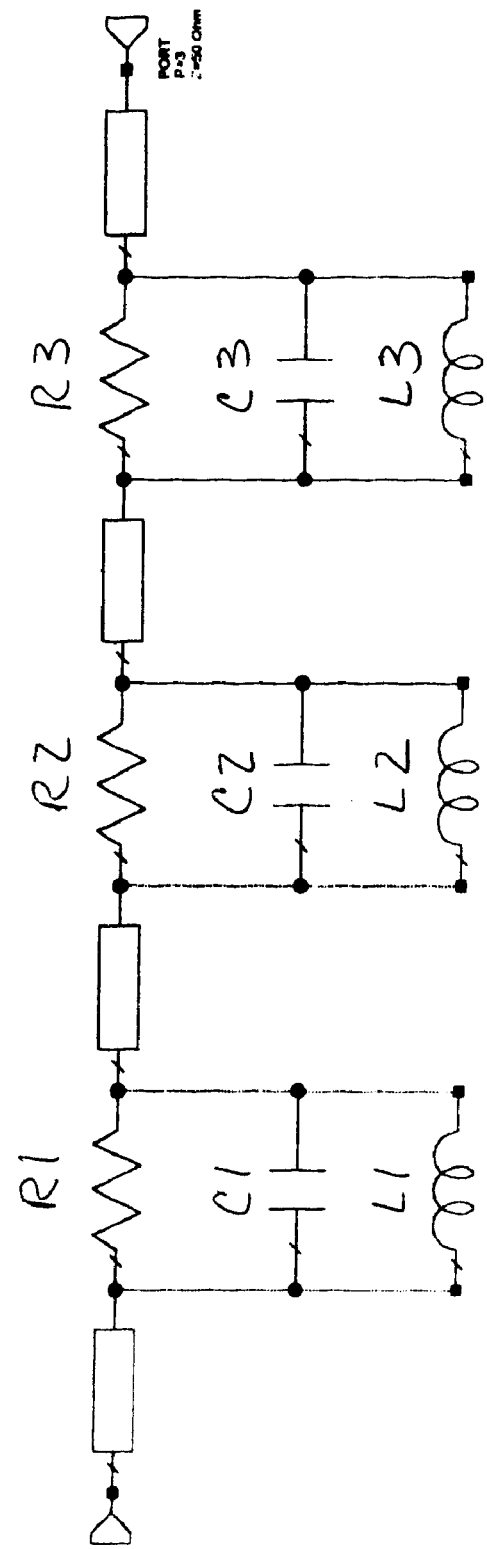
FIG. 3 is a circuit diagram of a first embodiment of the present invention.

The equivalent circuit of this RF attenuator is shown in FIG. 3 where the thermistors are designated R1-R3, their intrinsic capacitances C1-C3 and the inductive terms L1-L3. The value of L1-L3 may be varied to provide an optimum attenuator response in the frequency range from 1 to 100 GHz.

Figure 4:
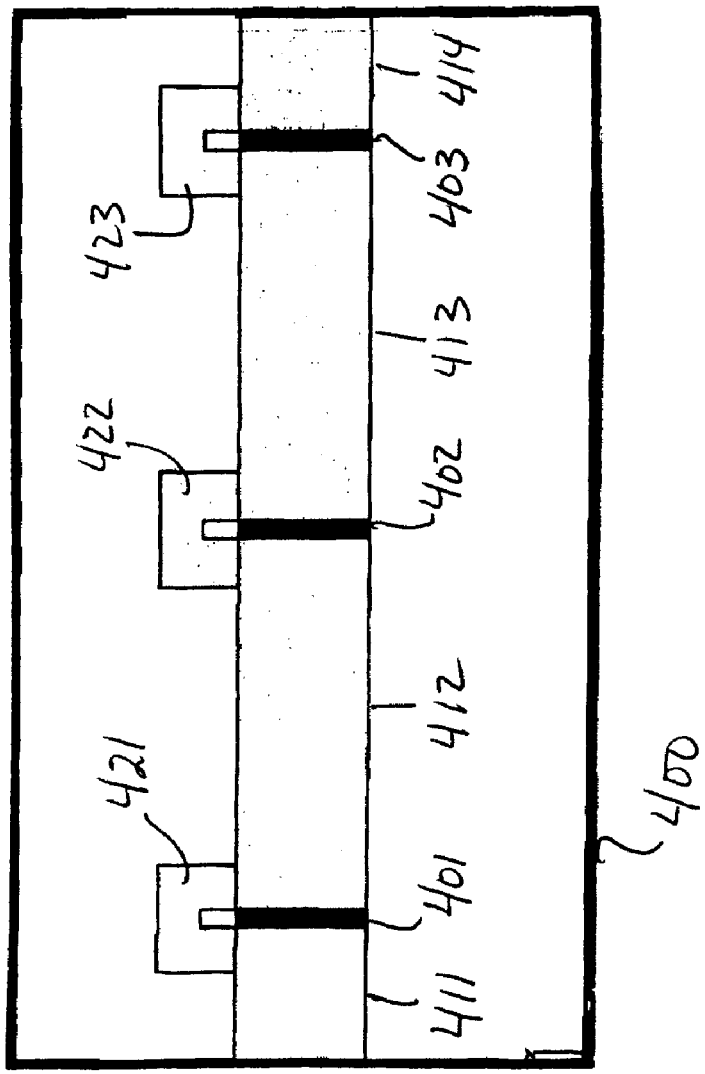
FIG. 4 is an illustration of the first embodiment of the invention.

The physical realization of the attenuator is shown in attenuator 400 of FIG. 4 where the thermistors are designated 401-403 and the inductive elements 421-423. Preferably, the thermistors and inductive elements are formed as thick-film structures on the surface of a ceramic substrate and are interconnected by transmission lines 411-414.

Figure 5:
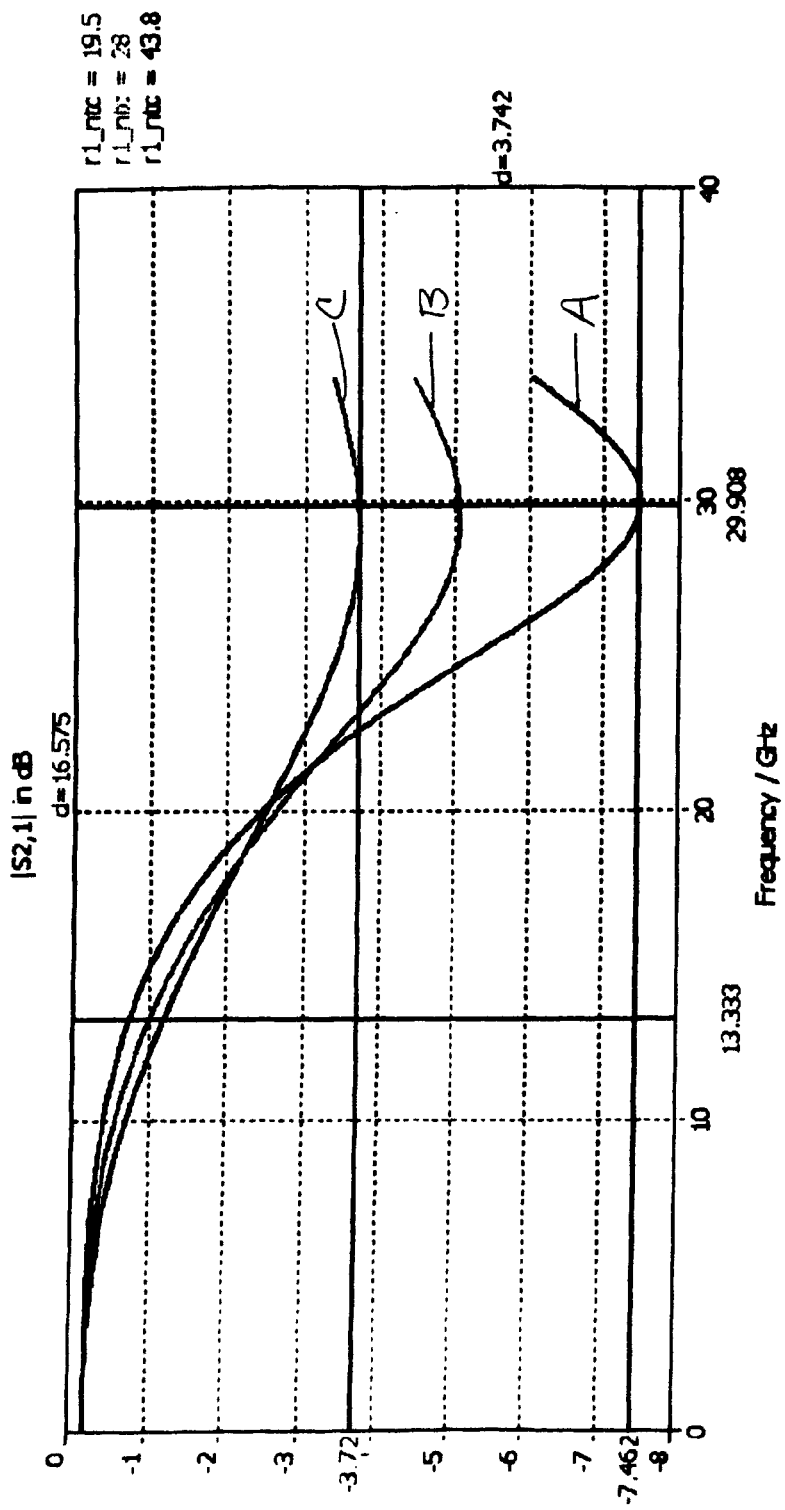
FIG. 5 is a plot of attenuation versus frequency of the circuit of FIG. 3 at different temperatures.

An example of the performance of attenuator 400 for three different ambient temperatures is shown in FIG. 5. The plot shows a device with inductive elements chosen to optimize the attenuator's at 30 GHz. Curve A depicts the attenuation with frequency at a temperature of −10 degrees C.; curve B at a temperature of 20 degrees C.; and curve C at a temperature of 50 degrees C.

What is claimed is:

1. A temperature-dependent attenuator, comprising:
   a first temperature-dependent resistor disposed in series with a transmission line, said first temperature-dependent resistor changing resistance with temperature according to a positive temperature coefficient of resistance;
   a first inductive element shunting said first temperature dependent resistor;
   a second temperature-dependent resistor disposed in series with said transmission line approximately one-quarter wavelength from said first temperature-dependent resistor at a desired frequency, said second temperature-dependent resistor changing resistance with temperature according to a negative temperature coefficient of resistance, said first and second temperature coefficients configured such that said attenuator changes attenuation at a desired rate with changes in temperature; and
   a second inductive element shunting said second temperature dependent resistor.

2. The temperature-dependent attenuator of claim 1, further comprising a third temperature-dependent resistor disposed in series with said transmission line approximately one-quarter wavelength from said second temperature-dependent resistor such that said second temperature-dependent resistor lies electrically between said first temperature-dependent resistor and said third temperature-dependent resistor, said third temperature-dependent resistor changing resistance with temperature according to a third temperature coefficient.

3. The temperature dependent attenuator of claim 2 further comprising a third inductive element shunting said third temperature-dependent resistor.

* * * * *